United States Patent
Ma et al.

(10) Patent No.: US 8,604,689 B2
(45) Date of Patent: Dec. 10, 2013

(54) HYBRID COMPOSITE EMISSIVE CONSTRUCT AND LIGHT-EMITTING DEVICES USING THE SAME

(75) Inventors: Liping Ma, San Diego, CA (US); Shijun Zheng, San Diego, CA (US); Qianxi Lai, Vista, CA (US); Amane Mochizuki, San Diego, CA (US)

(73) Assignee: Nitto Denko Corporation, Osaka (JP)

( * ) Notice: Subject to any disclaimer, the term of this patent is extended or adjusted under 35 U.S.C. 154(b) by 78 days.

(21) Appl. No.: 13/293,537

(22) Filed: Nov. 10, 2011

(65) Prior Publication Data

US 2012/0121933 A1    May 17, 2012

Related U.S. Application Data

(60) Provisional application No. 61/412,505, filed on Nov. 11, 2010.

(51) Int. Cl.
*H01L 51/00* (2006.01)

(52) U.S. Cl.
USPC .......................................... 313/504; 313/512

(58) Field of Classification Search
USPC ................................. 313/498–512
See application file for complete search history.

(56) References Cited

U.S. PATENT DOCUMENTS

| | | |
|---|---|---|
| 6,010,796 A | 1/2000 | Kijima |
| 6,967,062 B2 | 11/2005 | Hatwar et al. |
| 7,198,859 B2 | 4/2007 | Kwong et al. |
| 7,211,823 B2 | 5/2007 | Tung et al |
| 2007/0035240 A1 | 2/2007 | Yang et al. |
| 2007/0099026 A1 | 5/2007 | Lee et al. |
| 2008/0152573 A1 | 6/2008 | Juni et al. |
| 2008/0224605 A1 | 9/2008 | Noh et al. |
| 2008/0238305 A1 | 10/2008 | Kondo et al. |
| 2008/0290791 A1 | 11/2008 | Lee et al. |
| 2009/0091255 A1 | 4/2009 | Lee et al. |
| 2009/0134783 A1 | 5/2009 | Lin et al. |
| 2009/0200927 A1 | 8/2009 | D'Andrade et al. |
| 2009/0236974 A1* | 9/2009 | Tamaru et al. ............. 313/504 |
| 2010/0133992 A1 | 6/2010 | Yang et al. |
| 2010/0213452 A1* | 8/2010 | Sisk et al. .................. 257/40 |

FOREIGN PATENT DOCUMENTS

| | | |
|---|---|---|
| EP | 2 166 589 | 3/2010 |
| WO | WO 2006/035596 | 4/2006 |
| WO | WO 2006/130883 | 12/2006 |
| WO | WO 2008/131750 | 11/2008 |
| WO | WO 2008/140505 | 11/2008 |
| WO | WO 2009/028832 | 3/2009 |
| WO | WO 2012/064987 | 5/2012 |
| WO | WO 2013/039914 | 3/2013 |

OTHER PUBLICATIONS

Cheng et al., "Enhanced Light Outcoupling in a Thin Film by Texturing Meshed Surfaces", Applied Physics Letters, 2007, vol. 90, pp. 3.

(Continued)

*Primary Examiner* — Anne Hines
(74) *Attorney, Agent, or Firm* — Knobbe, Martens, Olson & Bear LLP

(57) ABSTRACT

Emissive constructs having three emissive layers, each having the same fluorescent host are described. At least one of the layers further includes a phosphorescent dopant. Light-emitting devices including these emissive constructs are also described.

19 Claims, 6 Drawing Sheets

---

| |
|---|
| LiF(1nm)/Al(100nm) |
| TBPI (40 nm) |
| HO-3 (15 nm) |
| HO-3:YE-1(5%):Ir(piq)$_2$(acac)(0.5%) (5nm) |
| HO-3 (15 nm) |
| DTASi (30 nm) |
| PEDOT(30nm) |
| ITO(55nm) |

(56) References Cited

OTHER PUBLICATIONS

Gustafsson et al. "Flexible Light-Emitting Diodes Made from Soluble Conducting Polymer", Nature, Jun. 11, 1992, vol. 357, pp. 477-479.

Hsiao et al., "Emitting Layer Thickness Dependence of Color Stability in Phosphorescent Organic Light-Emitting Devices", Organic Electronics, 2010, vol. 11, No. 9, pp. 1500-1506.

Krummacher et al., "General Method to Evaluate Substrate Surface Modification Techniques for Light Extraction Enhancement of Organic Light Emitting Diodes", Journal of Applied Physics, 2006, vol. 100, pp. 6.

Reineke et al., "White Organic Light-Emitting Diodes with Fluorescent Tube Efficiency", Nature, May 14, 2009, vol. 459, Issue 7244, pp. 234-238.

Schwartz et al., "Harvesting Triplet Excitons from Fluorescent Blue Emitters in White Organic Light-Emitting Diodes", Advanced Materials, 2007, vol. 19, pp. 3672-3676.

Schwartz et al., "Triplet Harvesting in Hybrid White Organic Light-Emitting Diodes", Advanced Functional Materials, 2009, vol. 19, pp. 1-15.

Shih et al., "Efficient White-Light-Emitting Diodes Based on poly(N-vinylcarbazole) Doped with Blue Fluorescent and Orange Phosphorescent Materials", Applied Physics Letters, 2006, vol. 88, No. 25, pp. 251110-1-251110-3.

Su et al., "Highly Efficient Organic Blue-and White-Light-Emitting Devices Having a Carrier- and Exciton-Confining Structure for Reduced Efficiency Roll-Off", Advanced Materials, 2008, vol. 20, pp. 4189-4194.

Wang et al., "Harvesting Excitons via two Parallel Channels for Efficient White Organic LEDs with Nearly 100% Internal Quantum Efficiency: Fabrication and Emission-Mechanism Analysis", Advanced Functional Materials, 2009, vol. 19, No. 1, pp. 84-95.

International Search Report and Written Opinion in PCT Application No. PCT/US2011/060238, dated Jan. 19, 2012.

\* cited by examiner

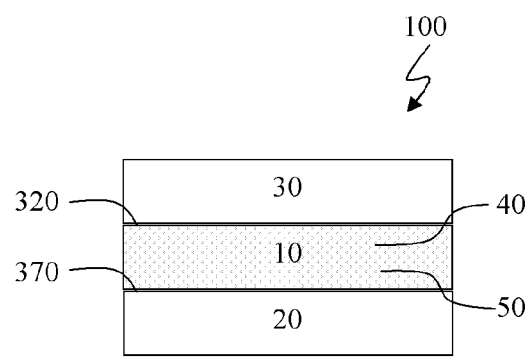 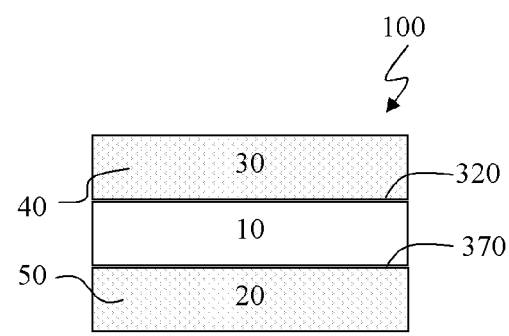
FIG. 1A    FIG. 1B
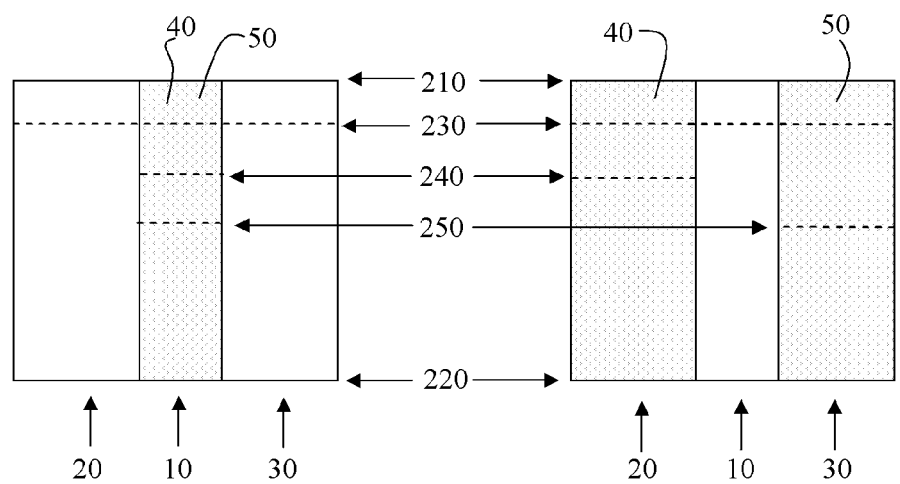
FIG. 2A    FIG. 2B

HYBRID COMPOSITE EMISSIVE CONSTRUCT AND LIGHT-EMITTING DEVICES USING THE SAME

CROSS-REFERENCE TO RELATED APPLICATIONS

This application claims the benefit of priority to U.S. Provisional Application No. 61/412,505, filed Nov. 11, 2010, which is incorporated herein by reference in its entirety.

BACKGROUND

1. Field

The embodiments describe herein relate to light-emitting devices, such as light-emitting devices comprising an emissive construct comprising a fluorescent host and a phosphorescent dopant.

2. Description of the Related Art

White organic light-emitting devices (WOLED) are promising candidates as replacements for fluorescent tubes and incandescent bulbs to save energy. However, there is room for improvement in current WOLED technology. For example, the power efficiency of WOLEDs may be improved to provide even greater energy savings. Phosphorescent WOLED (PH-WOLED) devices having exclusively phosphorescent emitters, have significantly improved efficiency as compared to devices having only fluorescent emitters. Unfortunately, phosphorescent blue emitters may have short useful lifetimes. The instability of phosphorescent blue emitters may be addressed by using a more stable florescent blue emitter to replace the unstable phosphor blue emitter while using green to red phosphorescent emitters. An OLED device having blue fluorescent emitters and green to red phosphorescent emitters may be referred to as a hybrid WOLED (HY-WOLED). Being less efficient than a PH-WOLED, a HY-WOLED can still be improved.

SUMMARY

An emissive construct comprising a fluorescent host material and a phosphorescent dopant may provide improved efficiency for devices such as light-emitting devices.

Some embodiments may include an emissive construct comprising: a first emissive layer disposed between a second emissive layer and a third emissive layer, wherein: the first emissive layer may comprise a first host material, the second emissive layer may comprise a second host material, and the third emissive layer may comprise a third host material; wherein each of the first host material, the second host material, and the third host material may emit blue light by fluorescence; at least one of the first emissive layer, the second emissive layer, and the third emissive layer may further comprise a first phosphorescent dopant; and least one of the first emissive layer, the second emissive layer, and the third emissive layer may be undoped.

Some embodiments may include an emissive construct comprising: a first emissive layer that may be disposed between a second emissive layer and a third emissive layer; wherein the first emissive layer may comprise a host material, the second emissive layer may comprise the host material, and the third emissive layer may comprise the host material; wherein: the host material may emit blue light by fluorescence; at least one of the first emissive layer, the second emissive layer, and the third emissive layer may comprise a first phosphorescent dopant; and at least one of the first emissive layer, the second emissive layer, and the third emissive layer may be a neat layer or may be undoped.

Some embodiments may include an emissive construct that may comprise: a first emissive layer disposed between a second emissive layer and a third emissive layer; wherein the first emissive layer may comprise a host material, the second emissive layer may comprise the host material, and the third emissive layer may comprise the host material; wherein the host material may emit blue light by fluorescence; and wherein the first emissive layer may comprise a first phosphorescent dopant, and the second emissive layer and the third emissive layer may be undoped; or the first emissive layer may be undoped, the second emissive layer may comprise a first phosphorescent dopant, and the third emissive layer may comprise a second phosphorescent dopant.

Some embodiments may include an emissive construct comprising: a first emissive layer disposed between a second emissive layer and a third emissive layer; wherein the first emissive layer comprises a host material, the second emissive layer comprises the host material, and the third emissive layer comprises the host material; wherein the host material emits blue light by fluorescence; and wherein the first emissive layer comprises a first phosphorescent dopant, and the second emissive layer and the third emissive layer are undoped; or the first emissive layer is undoped, the second emissive layer comprises a first phosphorescent dopant, and the third emissive layer comprises a second phosphorescent dopant; and a triplet energy of the host material is greater than a triplet energy of the first phosphorescent dopant; and at least one of the following relationship exists: a HOMO energy level of the first phosphorescent dopant is higher than a HOMO energy level of the host material; and a LUMO energy level of the first phosphorescent dopant is lower than a LUMO energy level of the host material.

Some embodiments may include a light-emitting device comprising an emissive construct described herein.

BRIEF DESCRIPTION OF THE DRAWINGS

FIGS. 1A and B are schematics of some embodiments of an emissive construct.

FIGS. 2A and B are schematics of the energetic structure of some embodiments of an emissive construct.

DETAILED DESCRIPTION

Figure 3:
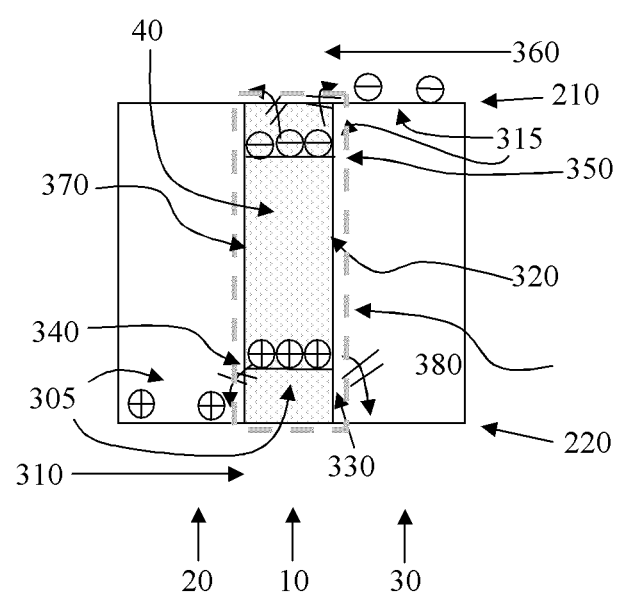
FIG. 3 is an energy diagram depicting HOMO and LUMO levels of an embodiment of an emissive construct.

The terms "T1," or "triplet energy," have the ordinary meaning understood by a person of ordinary skill in the art, and include the energy of the transition from lowest energy triplet state of an exciton to the ground state. There are many methods known in the art that may be used to obtain the triplet energy, such by obtaining phosphorescence spectrum.

The terms "highest occupied molecular orbital energy level" or "HOMO energy level" have the ordinary meaning understood by a person of ordinary skill in the art. In some embodiments, the HOMO energy level of a material may include the energy level of the highest energy molecular orbital that is occupied with at least one electron in the ground state.

The terms "lowest unoccupied molecular orbital energy level" or "LUMO energy level" have the ordinary meaning understood by a person of ordinary skill in the art. In some embodiments, the LUMO energy level of a material may include the energy level of the lowest energy molecular orbital that contains no electrons in the ground state.

The "work function" of a metal or electrical conductor may be a measure of the minimum energy required to extract an electron from the surface of the metal or conductor.

FIG. 1 is a schematic of two examples of an emissive construct 100. In both FIG. 1A and FIG. 1B, the emissive construct 100 may comprise a first emissive layer 10, that may be disposed between a second emissive layer 20 and a third emissive layer 30. There may be a first interface 370 between the first emissive layer 10 and the second emissive layer 20. There may also be a second interface 320 between the first emissive layer 10 and the third emissive layer 30. Alternatively, there may be an optional layer or layers between the first emissive layer 10 and the second emissive layer 20, and/or between the first emissive layer 10 and the third emissive layer 30. Each of the first emissive layer 10, the second emissive layer 20, and the third emissive layer 30 independently comprises a host material (not shown). In some embodiments, all three of the first, second, and third emissive layers 10, 20, and 30 may have the same host material (not shown).

In FIG. 1A, the first emissive layer 10 may comprise a first phosphorescent dopant 40, the second emissive layer 20 may be undoped, and the third emissive layer 30 may be undoped. In some embodiments, the first emissive layer 10 may further comprise a second phosphorescent dopant 50.

In, FIG. 1B, the first emissive layer 10 may be undoped, the second emissive layer 20 may comprise a first phosphorescent dopant 40, and the third emissive layer may comprise a second phosphorescent dopant 50. The first phosphorescent dopant 40 and the second phosphorescent dopant 50 may comprise substantially the same material or may comprise different materials.

In some embodiments, the efficiency of an emissive construct may be improved by configuring the emissive construct so that the excitons form in an emissive layer comprising a phosphorescent dopant, and/or an interface between an emissive layer comprising a phosphorescent dopant and an undoped emissive layer. If charges are trapped in a phosphorescent dopant, excitons may be formed in at or near an interface between a doped layer and an undoped layer. The triplet excitons of the dopant may then relax to the ground state by phosphorescence emission.

However, if the charges are not trapped in a phosphorescent dopant, the triplet excitons may not be confined to a generation zone at or near the interface. As a result, it may be more difficult to control the color generated. Another result may be a decreased efficiency of the emissive construct.

If a triplet exciton is formed too far from a doped emissive layer, it may not reach a phosphorescent dopant which may reduce device efficiency. Therefore, formation of excitons in a layer comprising a phosphorescent dopant, or at or near a boundary with a layer comprising a phosphorescent dopant, may improve efficiency of an emissive construct.

In some embodiments, the triplet energy of the host may be: at least about 0.05 eV, about 0.1 eV, or about 0.2 eV greater than the triplet energy of a phosphorescent dopant; and/or up to about 0.3 eV, about 0.70 eV, or about 1.6 eV greater than the triplet energy of a phosphorescent dopant.

FIG. 2 is a schematic of the triplet energetic structure of the examples in FIG. 1 where all three emissive layers comprise the same host material. In both FIG. 2A and FIG. 2B, the energy of the lowest unoccupied molecular orbital (LUMO) 210, the energy of the highest occupied molecular orbital (HOMO) 220, and the triplet energy 230 of the host material, may be about the same for all of the first emissive layer 10, the second emissive layer 20, and the third emissive layer 30, because all three materials have the same fluorescent host. The triplet energy 230 of the host material may be lower than the HOMO-LUMO energy gap of the host material.

The triplet energy of the host may be greater than the triplet energy of any phosphorescent dopants. For example, with respect to FIGS. 1 and 2, if a first phosphorescent dopant 40 and/or a second phosphorescent dopant 50 are present, the triplet energy 230 of the host material may be greater than the triplet energy 240 of the first phosphorescent dopant and the triplet energy 250 of the second phosphorescent dopant. Furthermore, in some embodiments, the triplet energy 240 of the first phosphorescent dopant 40 may be greater than the triplet energy 250 of the second phosphorescent dopant 50.

Thus, the relative triplet energy of a phosphorescent dopant as compared to that of a nonphosphorescent host may be tuned to increase the emission efficiency of triplet excitons. A number of parameters of an emissive construct and materials of the emissive construct may be varied to increase exciton formation in or near a particular layer such as a doped emissive layer. Some of these parameters may include relative HOMO/LUMO levels, electron mobility, hole mobility, layer thickness, etc.

One or more of the HOMO and LUMO energy levels of the phosphorescent dopants may help to trap holes and/or electrons so a doped emissive layer or its corresponding interface with undoped emissive layer may act as an exciton generation zone.

For example, FIG. 3 provides an energy diagram with HOMO and LUMO energy levels for an example of a device such as that depicted in FIG. 1A with a first phosphorescent dopant 40, and wherein the host material is the same for all three emissive layers. The HOMO energy level 340 of the first phosphorescent dopant 40 may be higher than the HOMO energy level 220 of the host material. In this particular example, holes 305 may travel in the direction indicated 310, or through the second emissive layer 20, through the first emissive layer 10, and then to the second interface 320 with the third emissive layer 30. As holes 305 in the second emissive layer 20 reach the first interface 370 with the first emissive layer 10, the electrons in the HOMO 340 of the first phosphorescent dopant 40 may readily drop down into the lower energy HOMO 220 of the host, thus transferring holes 305 into the HOMO 340 of the first phosphorescent dopant 40.

Once the holes 305 are in the HOMO 340 of the first phosphorescent dopant, they may not be able to readily return to the HOMO 220 of the host. This may be because transferring a hole from the dopant HOMO 340 to the host HOMO 220 may require an electron in the HOMO 220 of the host be transferred into the HOMO 340 of the first phosphorescent dopant 40. If HOMO energy level 340 of the first phosphorescent dopant 40 is substantially higher than the HOMO energy level 220 of the host, such an electron transfer may be significantly impeded. Since hole transfer from the first emissive layer 10 to the second emissive layer 20 or the third emissive layer 30 may require transfer of a hole from the HOMO 340 of the first phosphorescent dopant to a HOMO 220 of the host, holes may become trapped in the first emissive layer.

Furthermore, with respect to FIG. 3, the LUMO energy level 350 of the first phosphorescent dopant 40 may be lower than the LUMO energy level 210 of the host material. In this particular example, electrons 315 may travel in the direction indicated 360, or through the third emissive layer 30, through the first emissive layer 10, and then to the first interface 370 with the second emissive layer 20. As the electrons 315 in the third emissive layer 30 reach the second interface 320 with the first emissive layer 10, the electrons 315 in the LUMO 210 of the host may drop down into the lower energy LUMO 350 of the first phosphorescent dopant 40. Once the electrons 315 are in the lower energy LUMO 350 of the first phosphorescent dopant, they may then have insufficient energy to transfer to the higher energy LUMO 210 of the host. Thus, the electrons may be confined to the first emissive layer 10 because transfer to either the second emissive layer 20 or the third emissive layer 30 may require the electron 305 to obtain sufficient energy to be promoted to the higher energy LUMO 210 of the host.

Thus, in the device example of FIG. 3, or any device wherein: a phosphorescent dopant has a HOMO energy level that is higher than a host HOMO energy level, and the phosphorescent dopant has a LUMO energy level that is lower than a host LUMO energy level, electrons 315 and holes 305 may become simultaneously trapped in the first emissive layer. The accumulation of electrons 315 and holes 305 in the first emissive layer may create an exciton generation zone 380 that may comprise the first emissive layer 10, the first interface 370 between the first emissive layer 10 and the second emissive layer 20, and/or the second interface 320 between the first emissive layer 10 and the third emissive layer 30.

However, charge trapping may occur even if the HOMO energy level 220 of the host is similar to the HOMO energy level 340 of the first phosphorescent dopant 40. In this situation, although the HOMO energy levels of the materials may not confine holes 305 to the first emissive layer 10, the accumulation of electrons 315 in the first emissive layer 10 may still create a similar exciton generation zone 380 if the LUMO energy level 350 of the first phosphorescent dopant 40 is significantly lower than the LUMO energy level 210 of the host. Therefore, in some embodiments, the LUMO energy level 20 of a host may be: at least about 0.05 eV, about 0.1 eV, or about 0.2 eV higher or less negative than the LUMO energy level 350 of a phosphorescent dopant; and/or up to about 0.3 eV, about 0.70 eV, or about 1.6 eV higher than the HOMO energy level of a phosphorescent dopant.

Similarly, charge trapping may occur even if the LUMO energy level 210 of the host is similar to the LUMO energy level 350 of the first phosphorescent dopant 40. In this situation, although the LUMO energy levels of the materials may not confine electrons 315 to the first emissive layer 10, the accumulation of holes 305 in the first emissive layer 10 may still create a similar exciton generation zone 380 if the HOMO energy level 340 of the first phosphorescent dopant 40 is significantly higher than the HOMO energy level 220 of the host. Therefore, in some embodiments, the HOMO energy level of a phosphorescent dopant may be: at least about 0.05 eV, about 0.1 eV, or about 0.2 eV higher (less negative) than the HOMO energy level of a host and/or up to about 0.3 eV, about 0.70 eV, or about 1.6 eV higher than the HOMO energy level of a host.

Additional phosphorescent dopants may be present, and the same principles apply as those explained for the first phosphorescent dopant with respect to FIG. 3. However, for simplicity in describing these principles, they were not depicted in FIG. 3.

A phosphorescent dopant may reduce hole and/or electron mobility through a layer. Thus, an emissive layer that is doped with a phosphorescent dopant may have a hole mobility and/or an electron mobility that is reduced by a factor of: at least about 2, about 4, about 5, about 10, about 100, or about 1000; and/or up to about 10,000, 100,000, 500,000 or about 1,000,000 as compared to an undoped layer comprising the same host material. For example, the first emissive layer 10 in FIG. 1A may have a reduced hole mobility and/or electron mobility as compared to the second emissive layer 20 and the third emissive layer 30. Similarly, in FIG. 1B, the first emissive layer 10 may have a higher hole mobility and/or electron mobility as compared to the second emissive layer 20 and the third emissive layer 30.

Exciton formation may increase as the concentration of electrons and/or holes increases and/or as the mobility of electrons and/or holes increases. A significantly reduced hole and/or electron mobility in a doped emissive layer may cause a buildup of holes and/or electrons in the doped emissive layer because reduced rate of movement increases the time that a hole and/or electron is in the doped emissive layer. This increase in the relative concentration or population of holes and/or electrons may increase the number of excitons generated in the doped emissive layer relative to other layers. It may also increase the number of excitons formed at the interface with a higher hole and/or electron mobility material. This may be because both a high concentration of holes and/or electrons and a high mobility favor exciton formation, and the interface has a high concentration of holes and/or electrons from the low mobility layer, and a high electron and/or hole mobility from the higher mobility layer.

With respect to an emissive construct such as that depicted in FIG. 3, a host material having an electron mobility which is about the same as a hole mobility may increase the tendency of excitons to form in an exciton generation zone 380. A second emissive layer 20 having about the same thickness as the third emissive layer 30 may also increase the tendency of excitons to form in the exciton generation zone 380. In some embodiments, the second emissive layer 20 may be about 2 nm thick to about 50 nm thick, and/or the third emissive layer 30 may be about 2 nm thick to about 50 nm thick.

The average distance that an exciton travels before relaxing to the ground state may be referred to as the "diffusion length." Triplet diffusion lengths may be much larger, in the range of about 10 nm to about 100 nm, than singlet diffusion lengths, which may be in the range of less than about 10 nm. Thus, in some embodiments, the thickness of an undoped layer may be increased to increase fluorescent emission which may increase the amount of blue emission in an emissive construct. Since triplet diffusion lengths may be much greater, this may be done without reducing the triplet emission. Thus, in some embodiments, an undoped emissive layer may have a thickness that is: at least about 1 nm, at least about 2 nm, at least about 5 nm, or at least about 10 nm; up to about 50 nm, about 70 nm, about 100 nm, or about 150 nm; and/or about 15 nm to about 20 nm.

In some embodiments, an emissive layer comprising a phosphorescent dopant may have a thickness that is: at least about 1 nm, about 2 nm, or about 5 nm; and/or up to about 10 nm, about 15 nm, or about 20 nm. In some embodiments, the undoped emissive layer(s) may be about 15 nm to about 20 nm thick; and/or the doped emissive layer(s) may be about 2 to about 10 nm thick.

In some embodiments, the devices described herein may be configured to emit white light. The white light may be provided by a combination of emission from the host material of one color, emission from the first phosphorescent dopant of a second color, and emission from the second phosphorescent dopant of a third color.

Any material that emits light by fluorescence may be used as a host material, including a first host material, a second host material, a third host material, etc. In some embodiments, the host material may emit blue light by fluorescence. For example, the host material may have a fluorescence emissive peak wavelength that is: at least about 400 nm, about 420 nm, about 440 nm, or about 450 nm; up to: 480 nm, about 490 nm, about 495 nm, or about 500 nm; and/or about 460 nm to about 480 nm, or about 470 nm. In some emissive constructs, the host material may be present in all emissive layers, such as the first emissive layer, the second emissive layer, and the third emissive layer.

As explained above, any host material may have a triplet energy that is greater than any phosphorescent dopants. For example, a host material may have a triplet energy that is at least: about 2.0 eV, about 2.2 eV, about 2.5 eV, or about 2.6 eV; and/or up to about 2.8 eV, about 2.9 eV, or about 3.2 eV.

Any host material may be ambipolar, and thus may be capable of transporting both holes and electrons. In some embodiments, the ratio of electron mobility to hole mobility may be: at least about 0.001, about 0.01, about 0.1, about 0.5, or about 0.9; and/or may be up to about 1.1, about 5, about 10, about 100, or about 1000; and/or may be about 1. Some examples of host materials are shown in Table 1 below with their estimated HOMO and LUMO energies. In some embodiments, the host comprises at least one of: HO-3, HO-2, NPD, and 4PNPD. For example, the first host material, the second host material, and/or the third host material may comprise at least one of: HO-3, HO-2, NPD, and 4PNPD

TABLE 1

| Host material | LUMO energy level (eV) | HOMO energy level (eV) |
|---|---|---|
| NPD | −2.7 | −5.2 |
| 4PNPD | −2.7 | −5.6 |
| HO-2 | −2.88 | −5.96 |
| HO-3 | −2.33 | −5.23 |

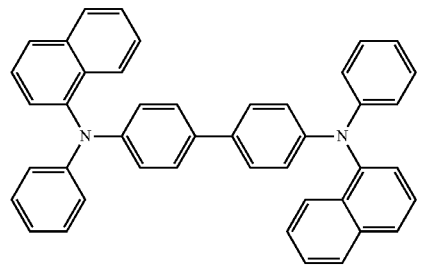 [SMILES: c1ccc(N(c2ccc(-c3ccc(N(c4ccccc4)c4cccc5ccccc45)cc3)cc2)c2cccc3ccccc23)cc1]

NPD

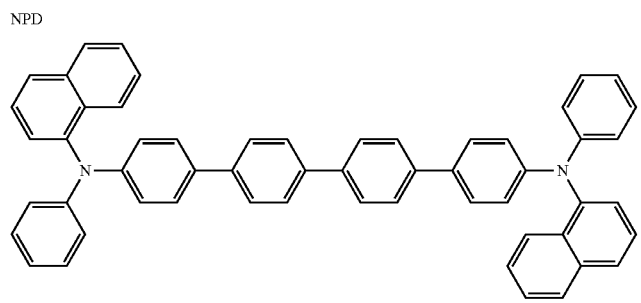

4P-NPD

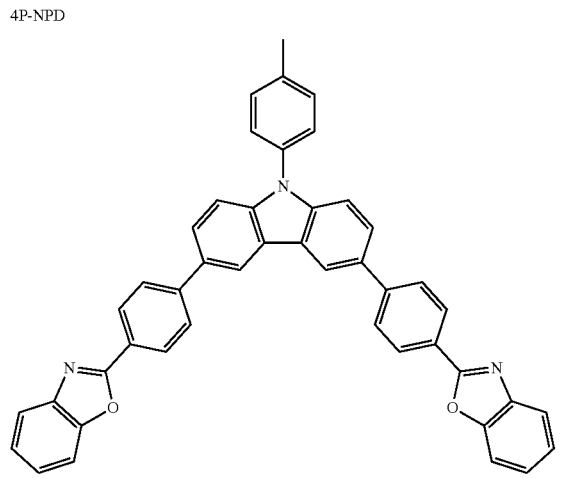

HO-2
2,2'-(4,4'-(9-p-tolyl-9H-carbazole-3,6-diyl)bis(4,1-phenylene))dibenzo[d]oxazole TABLE 1-continued

| Host material | LUMO energy level (eV) | HOMO energy level (eV) |
|---|---|---|

HO-3

For other materials, including other host materials, the HOMO and LUMO energy levels may be obtained by several conventional methods known in the art, e.g. solution electrochemistry, ultraviolet photoelectron spectroscopy (UPS), inverse photoemission spectroscopy, etc. In some embodiments, HOMO and LUMO energy levels for organic materials to be used in OLEDs may be obtained using a cyclic voltammetry (CV) instrument (model μAutolab type II) manufactured by Metrohm USA (Riverview, Fla., USA) in conjunction with GPES/FRA software (version 4.9).

A phosphorescent dopant may be any material that emits light by phosphorescence. The materials used for a first phosphorescent dopant, a second phosphorescent dopant, and any additional phosphorescent dopants that may be present, are interchangeable, and the first phosphorescent dopant and the second phosphorescent dopant may be the same material.

In some embodiments, a phosphorescent dopant may emit photons that are in the green to red range, such as about 480 nm to about 800 nm. For example, some green photons may have a wavelength in the range of: at least about 480 nm or about 490 nm to about 560 nm or about 570 nm; some yellow photons may have a wavelength in the range of: at least about 560 nm or about 570 nm to about 580 nm or about 590 nm; some orange photons may have a wavelength in the range of: at least about 580 nm or about 590 nm to about 620 nm or about 630 nm; some red photons may have a wavelength in the range of: at least about 620 nm or about 630 nm to about 760 nm or about 800 nm, etc. The light emitted from a phosphorescent dopant that has a peak emissive wavelength in a range described above may appear to have a color associated with that range.

The color of the light emitted by an emissive construct may be tuned according to any phosphorescent dopants used. For example, the color of the emitted light may depend upon the color of the light emitted from a phosphorescent dopant. The color of the emitted light may also depend upon the concentration of a phosphorescent dopant. For example, an increased concentration of a green phosphorescent dopant may make the light emitted by an emissive construct to be greener, or an increased concentration of an orange phosphorescent dopant may make the light emitted by an emissive construct more orange, etc. Thus, the color may be tuned to obtain a white light-emitting emissive construct, or an emissive construct that emits any desired color.

In some embodiments, a phosphorescent dopant may comprise an Ir complex. Some examples of phosphorescent dopants comprising an Ir complex may include Ir-(pq)2acac, Ir(phq)2acac, Ir(piq)2acac, Ir(piq)3, YE-1, PO-01, etc. For example, the first phosphorescent dopant and/or the second phosphorescent dopant may comprise at least one of: Ir-(pq)2acac, Ir(phq)2acac, Ir(piq)2acac, Ir(piq)3, YE-1, and PO-01.

YE-1

[Ir(pq)2(acac)]

PO-01

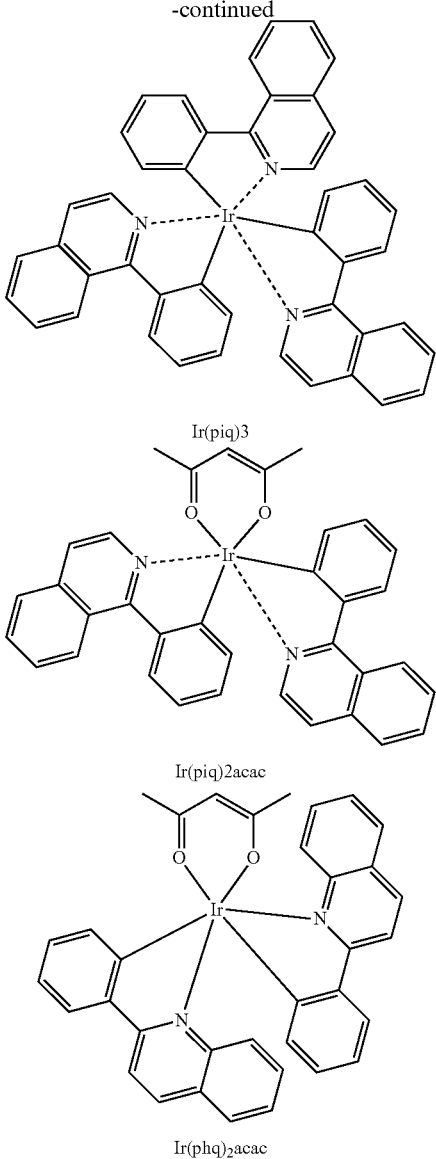

Ir(piq)3

Ir(piq)2acac

Ir(phq)2acac

In some embodiments, a fluorescent guest may be added to any of the emissive layers, such as the first emissive layer, the second emissive layer, the third emissive layer, etc.

In some embodiments, a light-emitting device may comprise an emissive construct described herein. For example, a light-emitting device may comprise: an anode, a cathode, and an emissive construct, wherein the emissive construct may be disposed between the anode and cathode.

An anode may be a layer, and may comprise any material having a higher work function than the cathode, including a conventional material such as a metal, mixed metal, alloy, metal oxide or mixed-metal oxide, or a conductive polymer. Examples of suitable metals include the Group 1 metals, the metals in Groups 4, 5, 6, and the Group 8-10 transition metals. If an anode layer is to be light-transmitting, mixed-metal oxides of Group 12, 13, and 14 metals or oxides of combinations thereof, such as Au, Pt, and indium-tin-oxide (ITO), may be used. An anode layer may include an organic material such as polyaniline, e.g., as described in "Flexible light-emitting diodes made from soluble conducting polymer," Nature, vol. 357, pp. 477-479 (11 Jun. 1992), graphene, e.g., as described in H. P. Boehm, R. Setton and E. Stumpp (1994). "Nomenclature and terminology of graphite intercalation compounds". Pure and Applied Chemistry 66: 1893-1901, and/or carbon nanotubes, e.g., Juni, et al, US App 20080152573 (WO/2008/140505). Examples of suitable high work function electrical conductors include, but are not limited to, Au, Pt, indium-tin-oxide (ITO), or alloys thereof. An anode layer may have any thickness suitable to perform its function, such as a thickness in the range of about 1 nm to about 1000 nm.

Approximate work functions of some materials which may be useful in an anode are included in Table 2 below.

TABLE 2

| Metal | Work Function (eV) |
|---|---|
| indium-tin-oxide (ITO) | 4.7 |
| indium-zinc-oxide (IZO) | 4.7 |
| Al | 4.28 |
| Ag | 4.26 |
| Zn | 4.33 |
| Zr | 4.05 |
| Sn | 4.42 |
| V | 4.3 |
| Hg | 4.49 |
| In | 4.12 |
| Ti | 4.3 |

A cathode may be a layer, and may include a material having a lower work function than the anode layer. Examples of suitable materials for the cathode layer may include alkali metals of Group 1, Group 2 metals, Group 12 metals including rare earth elements, lanthanides and actinides, materials such as aluminum, indium, calcium, barium, samarium and magnesium, and combinations thereof. Li-containing organometallic compounds, LiF, and Li$_2$O may optionally be deposited between the organic layer and the cathode layer to lower the operating voltage. Suitable low work function metals may include, but are not limited to, Al, Ag, Mg, Ca, Cu, Mg/Ag, LiF/Al, CsF, CsF/Al or alloys thereof. A cathode layer may have any thickness suitable to perform its function, such as a thickness in the range of range of about 1 nm to about 1000 nm.

Approximate work functions of some materials which may be useful in a cathode are included in Table 3 below.

TABLE 3

| Metal | Work Function (eV) |
|---|---|
| LiF/Al | 3.6 |
| Mg | 3.72 |
| Mg/Ag | 4.12 |
| Al | 4.28 |

In some embodiments, a light-emitting device may further include a hole-transport layer (HTL), which may be disposed between an emissive construct and an anode. A hole transport layer may comprise any hole-transport material, including known those known in the art. For some devices, the difference between a HOMO energy level of the material(s) in the HTL and the work function of the anode layer may be small enough to allow efficient hole transport from the anode. A HTL may optionally comprise a material that also functions as an electron blocking layer and/or an exciton blocking layer.

Some examples of hole-transport materials may include at least one of: an aromatic-substituted amine, a carbazole, a polyvinylcarbazole (PVK), e.g. poly(9-vinylcarbazole); N,N'-bis(3-methylphenyl)N,N'-diphenyl-[1,1'-biphenyl]-4, 4'-diamine (TPD); polyfluorene; a polyfluorene copolymer; poly(9,9-di-n-octylfluorene-alt-benzothiadiazole); poly(paraphenylene); poly[2-(5-cyano-5-methylhexyloxy)-1,4-phenylene]; 1,1-Bis(4-bis(4-methylphenyl)aminophenyl)cyclohexane; 2,9-Dimethyl-4,7-diphenyl-1,10-phenanthroline; 3,5-Bis(4-tert-butyl-phenyl)-4-phenyl[1,2,4]triazole; 3,4,5-Triphenyl-1,2,3-triazole; 4,4',4''-Tris(N-(naphthylen-2-yl)-N-phenylamino)triphenylamine; 4,4',4'-tris(3-methylphenylphenylamino)triphenyl amine (MTDATA); 4,4'-bis[N-(naphthyl)-N-phenyl-amino]biphenyl (α-NPD); 4,4'-bis[N,N'-(3-tolyl)amino]-3,3'-dimethylbiphenyl (HMTPD); 4,4'-N,N'-dicarbazole-biphenyl (CBP); 1,3-N,N-dicarbazole-benzene (mCP); poly(9-vinylcarbazole) (PVK); a benzidine; a phenylenediamine; a phthalocyanine metal complex; a polyacetylene; a polythiophene; a triphenylamine; an oxadiazole; copper phthalocyanine; N,N'N''-1,3,5-tricarbazoloyl-benzene (tCP); N,N'-bis(4-butylphenyl)-N,N'-bis(phenyl) benzidine; mixtures thereof, and the like.

Approximate LUMO energy levels and HOMO energy levels of some materials which may be useful as a hole-transport material are included in Table 4 below.

TABLE 4

| Hole-transport compound | LUMO energy level (eV) | HOMO energy level (eV) |
| --- | --- | --- |
| DTASi | −2.20 | −5.60 |
| TCTA | −2.43 | −5.83 |
| CBP | −2.80 | −6.10 |
| α-NPD | −2.40 | −5.50 |
| 4CzPBP | −2.60 | −6.06 |

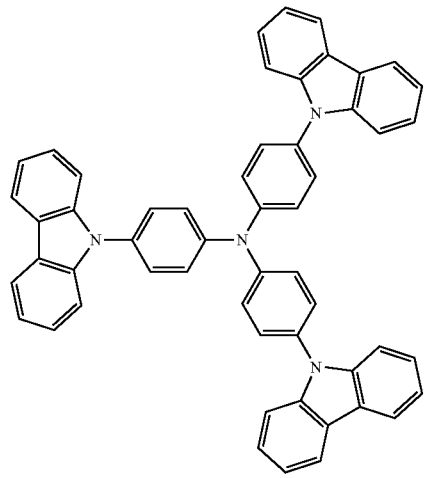 [SMILES: c1ccc2c(c1)c1ccccc1n2-c1ccc(N(c2ccc(-n3c4ccccc4c4ccccc43)cc2)c2ccc(-n3c4ccccc4c4ccccc43)cc2)cc1]

TCTA
4,4',4''-tris(carbazol-9-yl)-triphenylamine

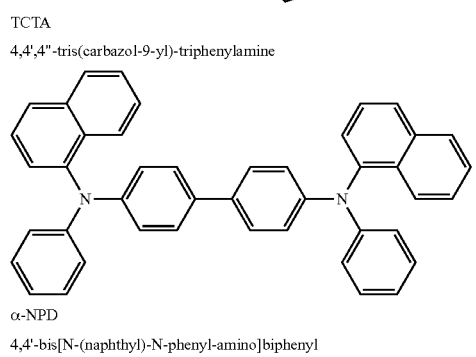

α-NPD
4,4'-bis[N-(naphthyl)-N-phenyl-amino]biphenyl

TABLE 4-continued

| Hole-transport compound | LUMO energy level (eV) | HOMO energy level (eV) |
| --- | --- | --- |

4CzPBP
2,2'-bis(4-carbazolylphenyl)-1,1'-biphenyl

CBP
4,4'-N,N'-dicarbazole-biphenyl

DTASi
Bis[4-(p,p'-ditolyl-amino)phenyl]diphenylsilane

In some embodiments, the light-emitting device may include an electron-transport layer (ETL), which may be disposed between the cathode layer and an emissive construct. An ETL may comprise any electron-transport material, including known those known in the art. For some devices, the difference between a LUMO energy level of the material(s) in the ETL and the work function of the cathode layer may be small enough to allow efficient electron transport from the cathode. Optionally, the ETL may be formed of material that may also function as a hole blocking layer and/or an exciton blocking layer.

Some examples of electron-transport material may include at least one of: 2-(4-biphenylyl)-5-(4-tert-butylphenyl)-1,3,4-oxadiazole (PBD); 1,3-bis(N,N-t-butyl-phenyl)-1,3,4-oxadiazole (OXD-7), 1,3-bis[2-(2,2'-bipyridine-6-yl)-1,3,4-oxadiazo-5-yl]benzene; 3-phenyl-4-(1'-naphthyl)-5-phenyl-1,2,4-triazole (TAZ); 2,9-dimethyl-4,7-diphenyl-phenanthroline (bathocuproine or BCP); aluminum tris(8-hydroxyquinolate) (Alq3); and 1,3,5-tris(2-N-phenylbenzimidazolyl)benzene; 1,3-bis[2-(2,2'-bipyridine-6-yl)-1,3,4-oxadiazo-5-yl]benzene (BPY-OXD); 3-phenyl-4-(1'-naphthyl)-5-phenyl-1,2,4-triazole (TAZ), 2,9-dimethyl-4,7-diphenyl-phenanthroline (bathocuproine or BCP); and 1,3,5-tris[2-N-phenylbenzimidazol-z-yl]benzene (TPBI). In some embodiments, the electron transport layer may be aluminum quinolate (Alq$_3$), 2-(4-biphenylyl)-5-(4-tert-butylphenyl)-1,3,4-oxadiazole (PBD), phenanthroline, quinoxaline, 1,3,5-tris[N-phenylbenzimidazol-z-yl]benzene (TPBI), or a derivative or a mixture thereof.

The LUMO energy level and HOMO energy level of some materials which may be useful as electron-transport material are included in Table 5 below.

TABLE 5
| Electron-transport material | LUMO energy level (eV) | HOMO energy level (eV) |
|---|---|---|
| TPBI | −2.70 | −6.20 |
| PBD | −2.60 | −6.20 |
| OXD-7 | −2.60 | −6.40 |
| TAZ | −2.70 | −6.30 |
| AlQ3 | −3.00 | −5.70 |
| BCP | −2.80 | −6.10 |
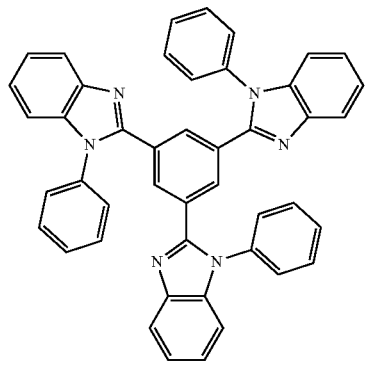 [SMILES: c1ccc(-n2c(-c3cc(-c4nc5ccccc5n4-c4ccccc4)cc(-c4nc5ccccc5n4-c4ccccc4)c3)nc3ccccc32)cc1]
TPBI
1,3,5-tris(N-phenylbenzimidizol-2-yl)benzene
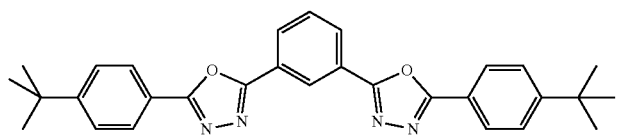 [SMILES: CC(C)(C)c1ccc(-c2nnc(-c3cccc(-c4nnc(-c5ccc(C(C)(C)C)cc5)o4)c3)o2)cc1]
OXD-7
1,3-bis[(p-t-butyl-phenyl)-1,3,4-oxadiazole]benzene
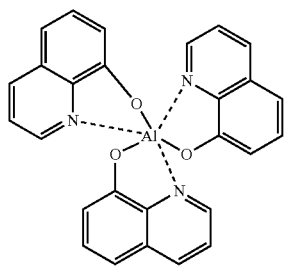
AlQ3
aluminum tris(8-hydroxyquinolate)
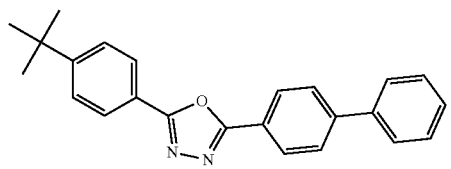 [SMILES: CC(C)(C)c1ccc(-c2nnc(-c3ccc(-c4ccccc4)cc3)o2)cc1]
PBD
2-(4-biphenylyl)-5-(4-tert-butylphenyl)-1,3,4-oxadiazole
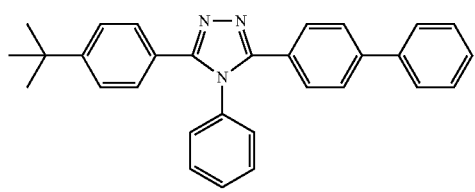 [SMILES: CC(C)(C)c1ccc(-c2nnc(-c3ccc(-c4ccccc4)cc3)n2-c2ccccc2)cc1]
TAZ
3-(4-Biphenylyl)-4-phenyl-5-tert-butylphenyl-1,2,4-triazole TABLE 5-continued

| Electron-transport material | LUMO energy level (eV) | HOMO energy level (eV) |
|---|---|---|

BCP
2,9-dimethyl-4,7-diphenyl-phenanthroline

In some light-emitting devices, the HOMO and LUMO energy levels for successive layers may be arranged in a stepwise configuration. In these devices the energy levels of the layer may gradually decrease going from the work function of the anode to the HOMO energy levels of the successive layers going from the anode. For example, the value of the work function or HOMO energy level may have a relative order such as: anode>hole-transport>emissive host>electron transport. In the other direction, the energy levels of the layers may gradually increase going from the work function of the cathode to the LUMO energy levels of the successive layer going from the cathode. For example, the value of the work function or the LUMO energy level may have a relative order such as: cathode<electron transport<emissive host<hole transport.

In some embodiments, the emissive construct may be anti-stepwise with respect to the rest of the device so that excitons may be more readily generated in the emissive construct. An anti-stepwise emissive construct may have: a host with a lower LUMO energy level than the two layers it is disposed between, such as an electron-transport layer and a hole-transport layer; and/or a host with a higher HOMO energy level than the two layers it is disposed between, such as an electron-transport layer and a hole-transport layer.

In embodiments wherein the emissive construct is anti-stepwise, the lower LUMO energy level in the host of the emissive construct may cause the energy gap between the host material and the hole-transport layer to be sufficiently large as to substantially impede electrons from moving into the hole-transport layer from the host material. Thus, the electrons may accumulate in the emissive construct, which may increase the generation of excitons. Similarly, the higher HOMO energy level in the host of the emissive construct may cause the energy gap between the host material and the hole-transport layer to be sufficiently large as to substantially impede holes from moving into the electron-transport layer from the host material. Thus, holes may accumulate in the emissive construct, which may increase the generation of excitons.

In some embodiments, a light-emitting device may include a hole-injection layer, which may be disposed between the emissive construct and the anode. Various suitable hole-injection materials that may be included in the hole-injection layer are known to those skilled in the art, such as an optionally substituted compound selected from the following: a polythiophene derivative such as poly(3,4-ethylenedioxythiophene (PEDOT)/polystyrene sulphonic acid (PSS), a benzidine derivative such as N,N,N',N'-tetraphenylbenzidine, poly(N,N'-bis(4-butylphenyl)-N,N'-bis(phenyl)benzidine), a triphenylamine or phenylenediamine derivative such as N,N'-bis(4-methylphenyl)-N,N'-bis(phenyl)-1,4-phenylenediamine, 4,4',4''-tris(N-(naphthylen-2-yl)-N-phenylamino)triphenylamine, an oxadiazole derivative such as 1,3-bis(5-(4-diphenylamino)phenyl-1,3,4-oxadiazol-2-yl) benzene, a polyacetylene derivative such as poly(1,2-bis-benzylthio-acetylene), and a phthalocyanine metal complex derivative such as phthalocyanine copper (CuPc). In some embodiments, hole-injection materials, while still being able to transport holes, may have a hole mobility substantially less than the hole mobility of conventional hole transport materials.

In some embodiments, the host material of the first emissive layer, the second emissive layer, and/or the third emissive layer may comprise HO-2, HO-3, NPD, and/or 4PNPD; first phosphorescent dopant may comprise Ir(PIQ)2(acac), Ir-(pq)2acac, Ir(phq)2acac, Ir(piq)3, YE-1, and/or PO-01; the first emissive layer may have a thickness that is about 1 nm to about 20 nm, or about 5 nm or about 15 nm; the second emissive layer may have a thickness that is about 1 nm to about 20 nm, or about 5 nm or about 15 nm; the third emissive layer may have a thickness that is about 1 nm to about 20 nm, or about 5 nm or about 15 nm. Some devices comprising this emissive construct may further comprise an electron-transport layer that may comprise TBPI. Such an electron-transport layer may be disposed between the second emissive layer and the cathode, and may have a thickness of about 30 nm to about 50 nm, or about 40 nm. In some of these devices, the cathode may be LiF/Al. Some of these devices comprising this emissive construct may further comprise a hole-transport layer that may comprise DTASi. A hole-transport layer may be disposed between the third emissive layer and a hole-injection layer. A hole injection layer may comprise PEDOT/PSS. The hole-transport layer may have a thickness of: at least about 10 nm or about 20 nm; and/or up to about 40 nm or about 150 nm; or may be about 30 nm. The hole injection layer may have a thickness of: at least about 2 nm, about 30 nm; an/or up to about 50 nm or about 100 nm; or may be about 40 nm. The hole-injection layer may be disposed between the hole-transport layer and the anode. The anode may be ITO.

A light-emitting device comprising an emissive construct described herein may be fabricated using techniques known in the art, as informed by the guidance provided herein. For example, a glass substrate may be coated with a high work function metal or metal oxide such as ITO which may act as an anode. After the anode layer is patterned, light-emitting layers of an emissive construct may be deposited on the anode. A cathode layer, which may comprise a low work functioning metal, such as LiF/Al, may then be deposited, e.g., vapor evaporated, onto the light-emitting layer. An electron transport layer and/or a hole transporting layer may also be added to the device using techniques known in the art, as informed by the guidance provided herein.

Example 1

Synthesis of an Example of a Host Compound

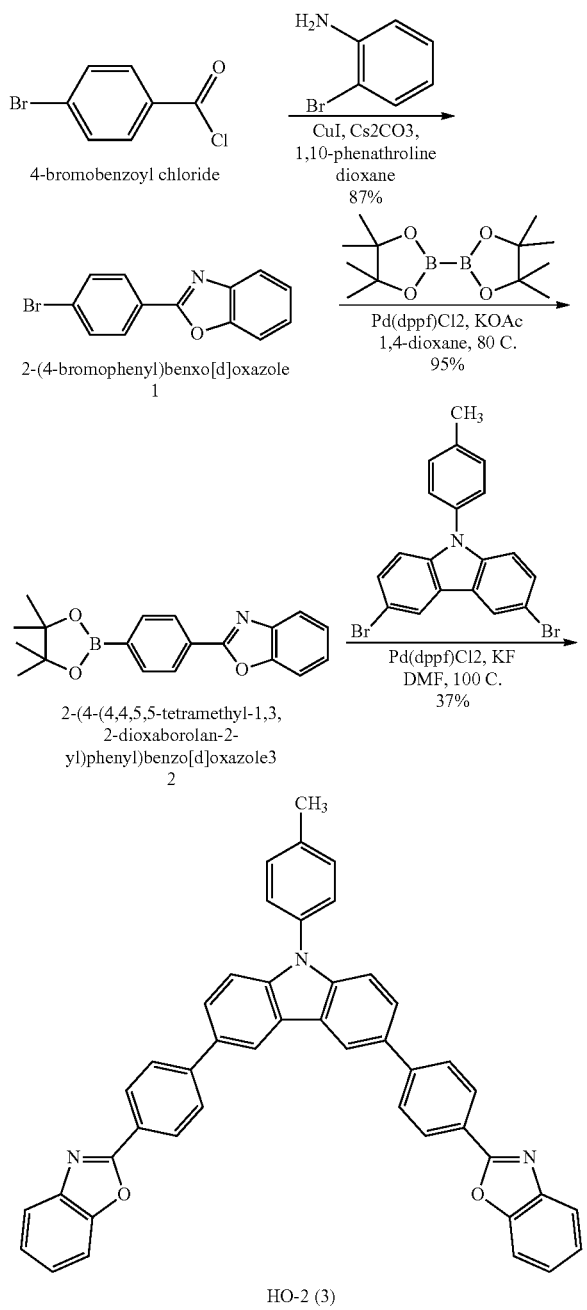

2-(4-bromophenyl)benzo[d]oxazole (1)

A mixture of 4-bromobenzoylchloride (4.84 g, 22 mmol), 2-bromoaniline (3.8 g, 22 mmol), CuI (0.21 g, 1.1 mmol), $Cs_2CO_3$ (14.3 g, 44 mmol) and 1,10-phenathroline (0.398 g, 2.2 mmol) in anhydrous 1,4-dioxane (80 mL) was degassed and heated at about 125° C. under argon overnight. The mixture was cooled and poured into ethyl acetate (~200 mL) and filtered. The filtrate was absorbed on silica gel, purified by column chromatography (hexanes/ethyl acetate 4:1), and precipitated by hexanes to give a white solid (5.2 g, in 87% yield).

2-(4-(4,4,5,5-tetramethyl-1,3,2-dioxaborolan-2-yl)phenyl)benzo[d]oxazole (2)

A mixture of 1 (4.45 g, 16 mmol), bis(pinacolate)diborane (4.09 g, 16.1 mmol), anhydrous potassium acetate (3.14 g, 32 mmol) and $Pd(dppf)Cl_2$ (0.48 g, 0.66 mmol) in anhydrous 1,4-dioxane (80 mL) was degassed and heated at about 85° C. for about 48 hours under argon. After cooling to room temperature, the mixture was poured into ethyl acetate (~200 mL) and filtered. The filtrate was absorbed on silica gel and purified by column chromatography (hexanes/ethyl acetate, 4:1) to give a white solid (4.15 g, in 81% yield).

HO-2 (3)

A mixture of 3,6-dibromo-9-p-tolyl-9H-carbazole (2.62 g, 6.35 mmol), 1 (4.08 g, 12.7 mmol), $Pd(dppf)Cl_2$ and KF (2.21 g, 38 mmol) in DMF (100 mL) was heated at about 120° C. under argon overnight. After the mixture was cooled to room temperature, it was poured into water (~200 mL) and filtered. The solid was collected and redissolved in chloroform (~200 mL). After the water was removed the chloroform solution was dried over $Na_2SO_4$. The chloroform solution was absorbed on silica gel, purified by column chromatography (with gradient of dichloromethane to dichloromethane/ethyl acetate 20:1), and recrystallized in dichloromethane to give a pale yellow crystalline solid (1.5 g, in 37% yield).

Example 2

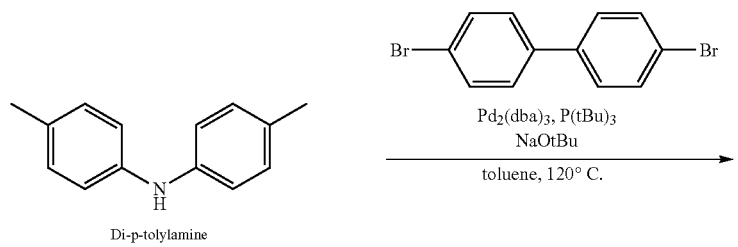

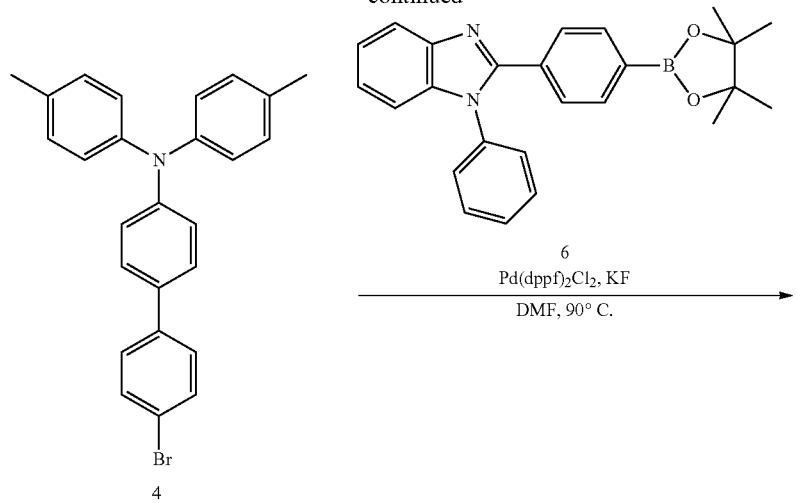

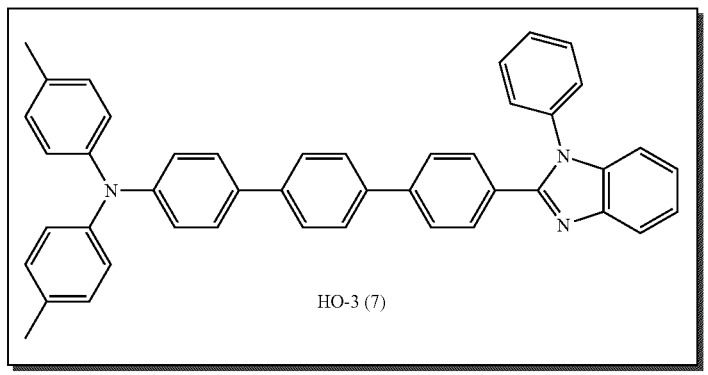

HO-3 (7)

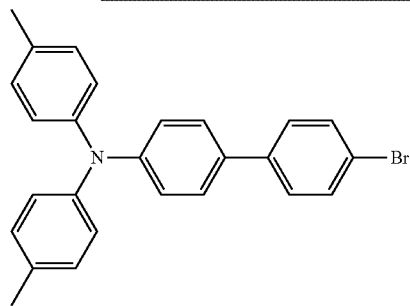

Compound 4

4'-bromo-N,N-di-p-tolylbiphenyl-4-amine (Compound 4)

A mixture of tris(dibenzylideneacetone)dipalladium (353 mg, 0.385 mmol), and tri-tert-butyl phosphine (3.11 g of a 10% solution in hexanes) was degassed in toluene (anhydrous, 50 mL) for 20 minutes. Di-p-tolylamine (3.00 g, 15.2 mmol), and 4, 4'-dibromobiphenyl (4.80 g, 15.4 mmol) were added and the mixture was further degassed for 15 minutes. Sodium tert-butoxide (2.4 g, 25 mmol) was added, and mixture was further degassed for 10 minutes. The whole was heated overnight at 120° C. under argon. After cooling, the mixture was poured into dichloromethane (DCM), and solids were filtered off. Filtrate was washed with water and brine. The organic layer was collected and dried over sodium sulfate, then loaded onto silica gel. A flash column (gradient of 2-20% ethyl acetate in hexanes) gave 190 mg of material (3% yield); confirmed pure by HNMR.

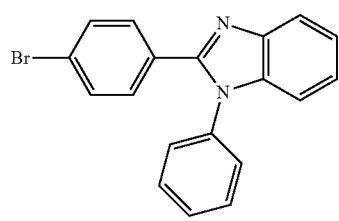

2-(4-bromophenyl)-1-phenyl-1H-benzo[d]imidazole
(5)

To a suspension of amide 1 (9.6 g, 26 mmol) in anhydrous 1,4-dioxane (100 mL) was added phosphorous oxychloride (POCl$_3$) (9.2 mL, 100 mmol) slowly. The whole was then heated at 100° C. overnight. After cooling to r.t., the mixture was poured into ice (200 g) with stirring. Filtration, followed by recrystallization in DCM/hexanes gave a pale grey solid (Compound 5) (8.2 g, in 90% yield).

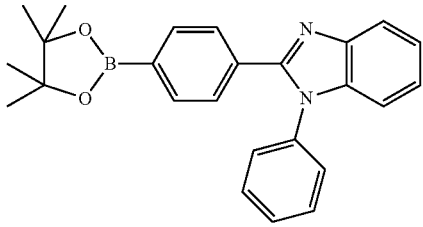

1-phenyl-2-(4-(4,4,5,5-tetramethyl-1,3,2-dioxaborolan-2-yl)phenyl)-1H-benzo[d]imidazole (6)

A mixture of Compound 5 (0.70 g, 2 mmol), bis(pinacolate)diborane (0.533 g, 2.1 mmol), 1,1'-Bis(diphenylphosphino)ferrocene]dichloropalladium (Pd(dppf)Cl$_2$) (0.060 g, 0.08 mmol) and anhydrous potassium acetate (0.393 g, 4 mmol) in 1,4-dioxane (20 mL) was heated at 80° C. under argon overnight. After cooling to r.t., the whole mixture was diluted with ethyl acetate (80 mL) then filtered. The solution was absorbed on silica gel, then purified by column chromatography (hexanes/ethyl acetate 5:1 to 3:1) to give a white solid (Compound 6) (0.64 g, in 81% yield).

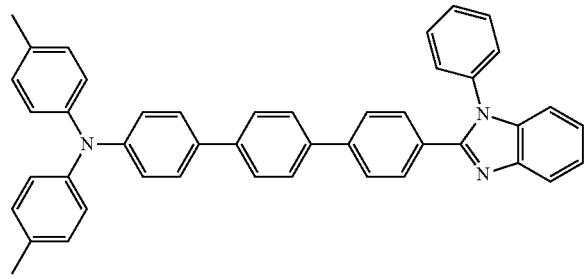 [SMILES: Cc1ccc(N(c2ccc(C)cc2)c2ccc(-c3ccc(-c4ccc(-c5nc6ccccc6n5-c5ccccc5)cc4)cc3)cc2)cc1]

Compound HO-3 (7)

A mixture of Compound 4 (170 mg, 0.397 mmol), 1-phenyl-2-(4-(4,4,5,5-tetramethyl-1,3,2-dioxaborolan-2-yl)phenyl)-1H-benzo[d]imidazole (173 mg, 0.436 mmol), 1,1'-Bis(diphenylphosphino)ferrocene]dichloropalladium (15 mg, 0.02 mmol), and potassium fluoride (70 mg, 1.2 mmol) was degassed in dimethylformamide (anhydrous, 15 mL) for 30 minutes. The mixture was heated to 90° C. overnight under argon. After cooling, the mixture was poured into water and filtered. The solids were dissolved in DCM (50 mL) and solution was washed with water and brine. The filtrate from first filtration was extracted with DCM (2×100 mL). All organic phases were combined, dried over sodium sulfate, and loaded onto silica gel. A flash column (gradient of 10-20% ethyl acetate in hexanes) and reprecipitation in DCM/methanol gave 146 mg (59% yield) of product (Compound 110-3); confirmed by HNMR.

Example 3

Fabrication of Hybrid an Example of a White Light-Emitting Device (Device-A)

ITO coated glass substrates were cleaned by ultrasound in water, acetone, and consecutively in 2-propanol, baked at 110° C. for 3 hours, followed by treatment with oxygen plasma for 5 min. A layer of PEDOT: PSS (Baytron P purchased from H.C. Starck) was spin-coated at 3000 rpm onto the pre-cleaned and O$_2$-plasma treated (ITO)-substrate and annealed at 180° C. for 30 min, yielding a thickness of around 55 nm. In a glove-box hosted vacuum deposition system at a pressure of $10^{-7}$ torr (1 torr=133.322 Pa), DTASi was first deposited on top of PEDOT/PSS layer at deposition rate of 0.06 nm/s, yielding a 30 nm thick film. Then the HO-3 was heated and deposited on top of DTASi, yielding a 5 nm thick film, followed by co-deposition of HO-3 and YE-1, Ir(PIQ)2 (acac) at depositions rates of about 0.06 nm/s to form a 5 nm thick layer, and deposition of another HO-3 layer having a thickness of about 5 nm. Then 1,3,5-tris(N-phenylbenzimidizol-2-yl)benzene (TPBI) at deposition rate around 0.06 nm/s was deposited on the last HO-3 layer to form a 40 nm thick film. LiF (1.0 nm) and Al (100 nm) were then deposited successively at deposition rates of 0.005 and 0.2 nm/s, respectively. Each individual device has areas of 0.08 cm$^2$.

Example 4

Device B (FIG. 4) was fabricated in the same manner, except that the two HO-3 layers were each 15 nm thick.

Example 5

Figures 4, 5:
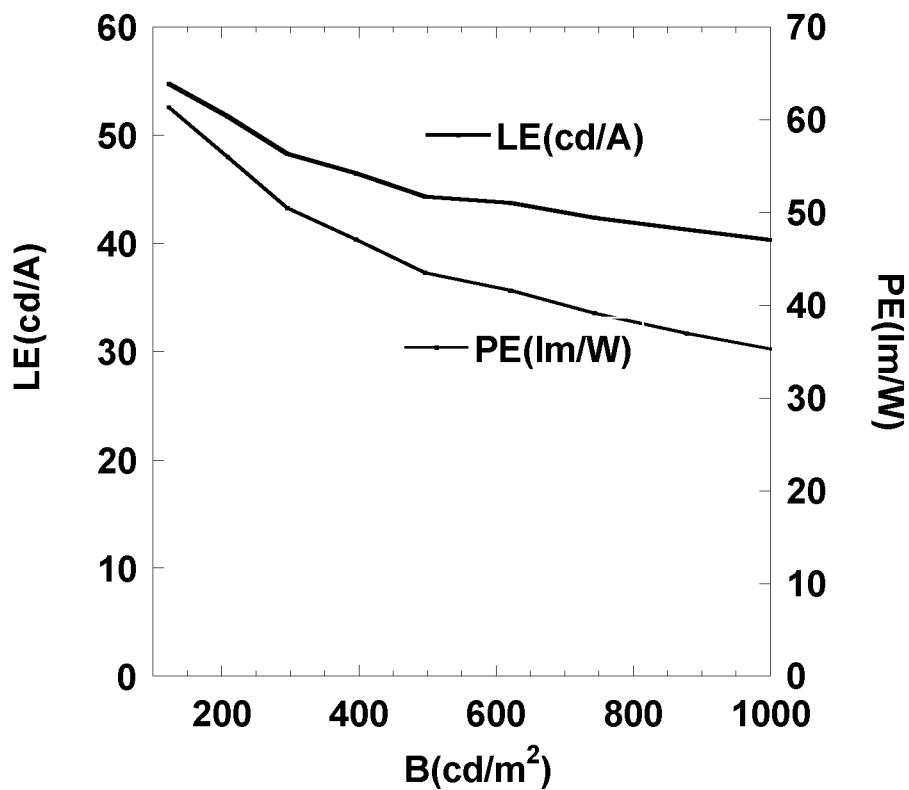
FIG. 4 is a schematic of an example of a light-emitting device as referred to in Example 2.
FIG. 5 is a plot of the luminescent efficiency and power efficiency as a function of luminance (B) of Device-A.

All spectra were measured with an Ocean Optics HR 4000 spectrometer and I-V-L characteristics were taken with a Keithley 2400 SourceMeter and Newport 2832-C power meter and 818 UV detector. All device operation was performed inside a nitrogen-filled glove-box. An example of a configuration of the device (Device-B) is shown in FIG. 4.

Figure 6:
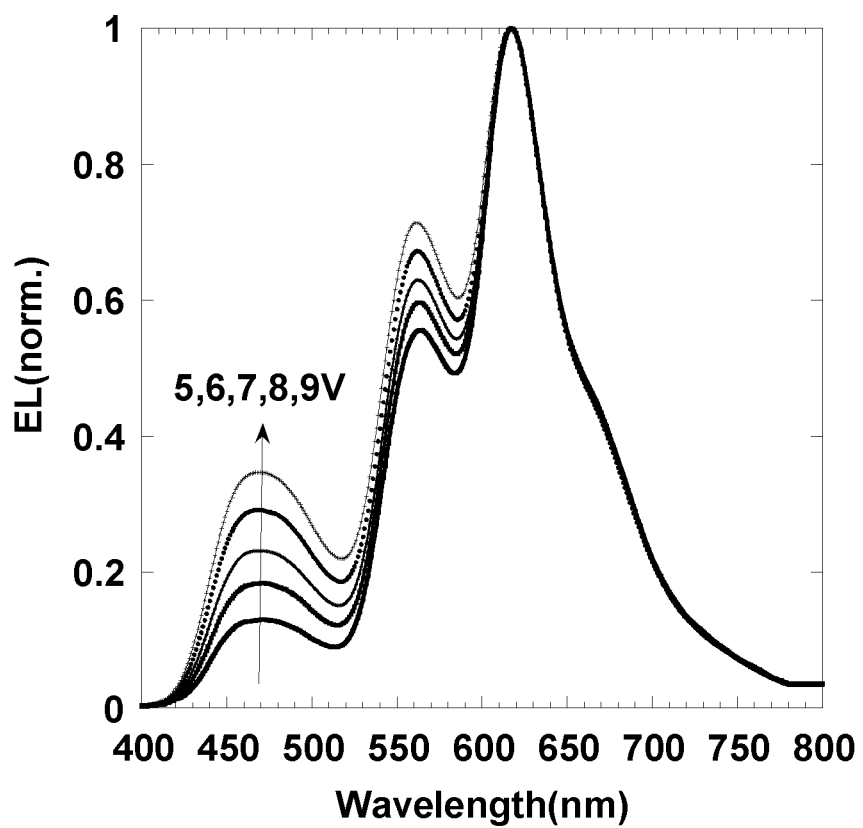
FIG. 6 is a plot of an electroluminescence spectrum of Device-A.
Figure 7:
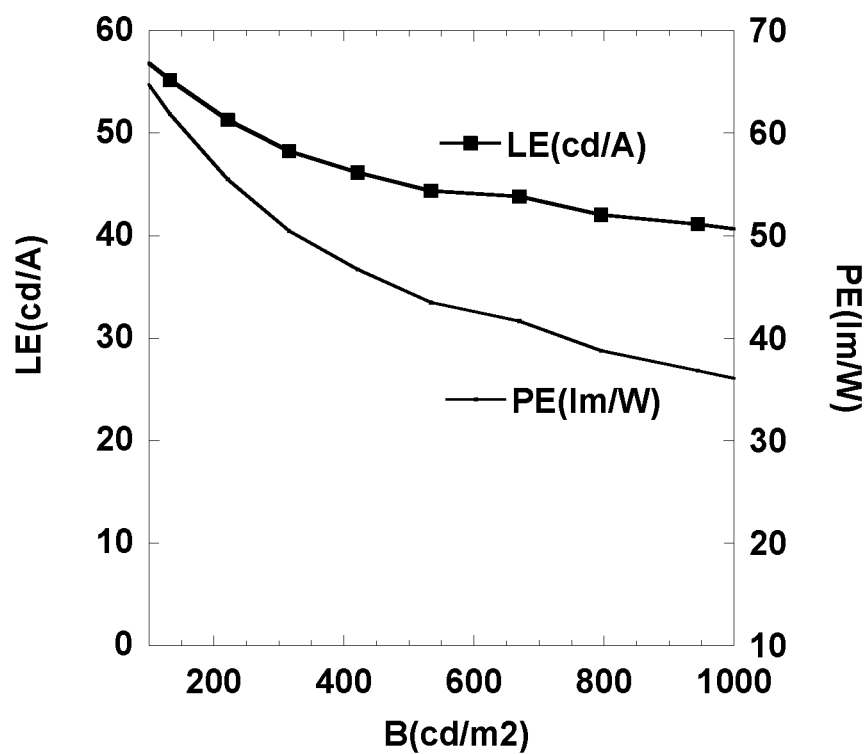
FIG. 7 is a plot of the luminescent efficiency and power efficiency as a function of luminance (B) of Device-B.
Figure 8:
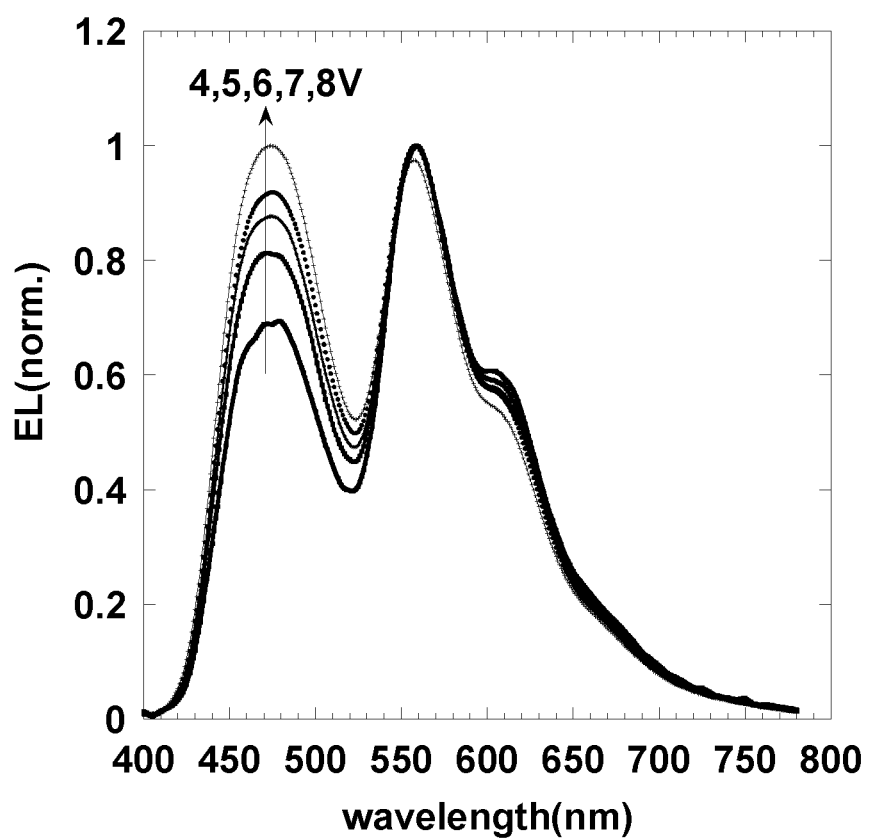
FIG. 8 shows electroluminescence spectrum of Device-B.

It is believed that the best known efficiency for a HY-WOLED is 25 lm/W at 1000 cd/m$^2$, reported by Karl Leo (*Adv. Funct. Mater.* 2009, 19, 1-15.) FIG. 5 is a plot of the luminescent efficiency and power efficiency as a function of luminance (B) of Device-A, and shows that the efficiency of Device-A at 1000 cd/m2 is about 35 Ml/W. FIG. 6 is a plot of the electroluminescence spectrum of Device-A. FIG. 7 is a plot of the luminescent efficiency and power efficiency as a function of luminance (B) of Device-B, and shows that the efficiency of Device-B at 1000 cd/m2 is about 36 lm/W. FIG. 8 shows electroluminescence spectrum of Device-B. The color rendering index CRI of Device B was 69.

Although the claims have been described in the context of certain preferred embodiments and examples, it will be understood by those skilled in the art that the scope of the claims extend beyond the specifically disclosed embodiments to other alternative embodiments and/or uses and obvious modifications and equivalents thereof.

What is claimed is:
1. An emissive construct comprising:
  a first emissive layer disposed between a second emissive layer and a third emissive layer;
  wherein the first emissive layer comprises a host material, the second emissive layer comprises the host material, and the third emissive layer comprises the host material;

wherein the host material emits blue light by fluorescence;
   wherein the first emissive layer comprises at least a first phosphorescent dopant, and the second emissive layer and the third emissive layer are undoped; or
   the first emissive layer is undoped, the second emissive layer comprises at least a first phosphorescent dopant, and the third emissive layer comprises at least a second phosphorescent dopant; and
   a triplet energy of the host material is greater than a triplet energy of the first phosphorescent dopant; and
   at least one of the following relationships exists:
   a HOMO energy level of the first phosphorescent dopant is higher than a HOMO energy level of the host material; and
   a LUMO energy level of the first phosphorescent dopant is lower than a LUMO energy level of the host material.

2. The emissive construct of claim 1, wherein the first emissive layer is undoped, the second emissive layer comprises at least a first phosphorescent dopant, and the third emissive layer comprises at least a second phosphorescent dopant, and the triplet energy of the host material is greater than a triplet energy of the second phosphorescent dopant.

3. The emissive construct of claim 1, wherein the host material is ambipolar.

4. The emissive construct of claim 1, wherein the first emissive layer comprises at least the first phosphorescent dopant, and the second emissive layer and the third emissive layer are undoped.

5. The emissive construct of claim 4, wherein the first phosphorescent dopant emits red, yellow, or orange photons.

6. The emissive construct of claim 5, wherein both the first phosphorescent dopant and the second phosphorescent dopant emit red, yellow, or orange photons.

7. The emissive construct of claim 5, wherein the first phosphorescent dopant emits red photons and the second phosphorescent dopant emits green photons.

8. The emissive construct of claim 4, wherein the first emissive layer further comprises a second phosphorescent dopant.

9. The emissive construct of claim 1, wherein the first emissive layer is undoped, the second emissive layer comprises at least a first phosphorescent dopant, and the third emissive layer comprises at least a second phosphorescent dopant.

10. The emissive construct of claim 9, wherein both the first phosphorescent dopant and the second phosphorescent dopant emit red, yellow, or orange photons.

11. The emissive construct of claim 9, wherein the first phosphorescent dopant emits red, yellow, or orange photons and the second phosphorescent dopant emits green photons.

12. A light-emitting device comprising the emissive construct of claim 1.

13. An emissive construct comprising:
   a first emissive layer disposed between a second emissive layer and a third emissive layer;
   wherein the first emissive layer comprises a host material, the second emissive layer comprises the host material, and the third emissive layer comprises the host material;
   wherein the host material emits blue light by fluorescence;
   at least one of the first emissive layer, the second emissive layer, and the third emissive layer comprises a first phosphorescent dopant; and
   at least one of the first emissive layer, the second emissive layer, and the third emissive layer is undoped.

14. The emissive construct of claim 13 wherein:
   the first emissive layer comprises the first phosphorescent dopant, and the second emissive layer and the third emissive layer are undoped; or
   the first emissive layer is undoped, the second emissive layer comprises the first phosphorescent dopant, and the third emissive layer comprises a second phosphorescent dopant.

15. The emissive construct of claim 13, wherein a triplet energy of the host material is greater than a triplet energy of the first phosphorescent dopant.

16. The emissive construct of claim 13, wherein a HOMO energy level of the first phosphorescent dopant is higher than a HOMO energy level of the host material.

17. The emissive construct of claim 13, wherein a LUMO energy level of the first phosphorescent dopant is lower than a LUMO energy level of the host material.

18. The emissive construct of claim 13, wherein a triplet energy of the host material is greater than a triplet energy of the second phosphorescent dopant.

19. The emissive construct of claim 13, wherein the host material is ambipolar.

* * * * *